United States Patent
Wang et al.

(10) Patent No.: US 10,782,615 B2
(45) Date of Patent: Sep. 22, 2020

(54) SILICON WAFER PROCESSING DEVICE AND METHOD

(71) Applicant: SHANGHAI MICRO ELECTRONICS EQUIPMENT (GROUP) CO., LTD., Shanghai (CN)

(72) Inventors: Gang Wang, Shanghai (CN); Yichao Shi, Shanghai (CN); Jie Jiang, Shanghai (CN); Dongliang Huang, Shanghai (CN); Haijun Song, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/608,968

(22) PCT Filed: Apr. 27, 2018

(86) PCT No.: PCT/CN2018/084774
§ 371 (c)(1),
(2) Date: Oct. 28, 2019

(87) PCT Pub. No.: WO2018/196838
PCT Pub. Date: Nov. 1, 2018

(65) Prior Publication Data
US 2020/0192228 A1    Jun. 18, 2020

(30) Foreign Application Priority Data
Apr. 28, 2017   (CN) .......................... 2017 1 0294642

(51) Int. Cl.
*G03F 7/20*   (2006.01)
*G03F 9/00*   (2006.01)

(52) U.S. Cl.
CPC .......... *G03F 7/2028* (2013.01); *G03F 9/7011* (2013.01)

(58) Field of Classification Search
CPC ............. H01L 21/681; H01L 21/67706; H01L 21/68764; G03F 7/2028; G03F 7/2022; G03F 9/7011; G03F 7/70258
See application file for complete search history.

(56) References Cited

U.S. PATENT DOCUMENTS 4,910,549 A * 3/1990 Sugita ................... G03F 7/2022
355/53
5,168,021 A * 12/1992 Arai ........................ G03F 7/168
250/442.11
(Continued)

FOREIGN PATENT DOCUMENTS

CN    105372941 A    3/2016
CN    105632971 A    6/2016
(Continued)

*Primary Examiner* — Steven Whitesell Gordon
(74) *Attorney, Agent, or Firm* — Muncy, Geissler, Olds & Lowe, P.C.

(57) ABSTRACT

Disclosed is a silicon wafer processing device; a pre-aligned optical assembly and an edge exposure assembly are provided on a synchronous bi-directional motion module, reducing the occupied space of the device and saving the installation cost; and furthermore, a synchronous bi-directional motion module, a rotation unit and a position compensation unit on a bottom plate are controlled by means of a control assembly, so as to reduce the operational complexity; and moreover, the synchronous bi-directional motion module is controlled to drive the pre-aligned optical assembly and the edge exposure assembly to simultaneously move, so that the operations of pre-aligning and edge exposure can be performed on silicon wafers of different sizes, thereby saving the switching time and increasing the (Continued)

work efficiency. Further disclosed is a method for processing a silicon wafer using a silicon wafer processing device.

10 Claims, 3 Drawing Sheets

(56) References Cited

U.S. PATENT DOCUMENTS

| | | | |
|---|---|---|---|
| 5,811,211 A * | 9/1998 | Tanaka | G03F 7/70066 382/145 |
| 6,052,173 A * | 4/2000 | Miura | H01L 21/681 355/53 |
| 6,721,037 B2 * | 4/2004 | Nagai | G03F 7/2028 355/53 |
| 7,901,854 B2 | 3/2011 | Huang et al. | |
| 2005/0150451 A1 * | 7/2005 | Tanaka | H01L 21/67184 118/688 |
| 2005/0248754 A1 | 11/2005 | Wang et al. | |
| 2006/0250594 A1 * | 11/2006 | Iwashita | G03F 7/2022 355/53 |
| 2007/0153246 A1 * | 7/2007 | Park | G03F 7/70791 355/53 |
| 2011/0063588 A1 * | 3/2011 | Kashiyama | G03F 7/2028 355/27 |
| 2016/0209763 A1 * | 7/2016 | Saito | G03F 7/2028 |
| 2017/0345696 A1 * | 11/2017 | Wang | H01L 21/67706 |

FOREIGN PATENT DOCUMENTS

| | | |
|---|---|---|
| CN | 105789085 A | 7/2016 |
| KR | 2006017986 A | 10/2006 |

* cited by examiner

SILICON WAFER PROCESSING DEVICE AND METHOD

TECHNICAL FIELD

The present application relates to a silicon wafer processing device and method in the microelectronic field, and in particular, to a silicon wafer pre-alignment and edge exposure device and method.

BACKGROUND

The development of microelectronic technology promotes the upgrading of the computer technology, communication technology and other electronic information technology. It plays an important leading and fundamental role in the information industry revolution. The lithography machine is an indispensable tool of the microelectronic manufacturing industry. Moreover, the silicon wafer pre-alignment system and the silicon wafer edge exposure system are important subsystems of the advanced package lithography machine.

There is a demand for the pre-alignment and edge exposure with an increasing degree of automation and a decreasing cost on the market at present. To reduce costs, the pre-alignment and the edge exposure functions are integrated into a single device in the industry. At present, the common layout of the pre-alignment and edge-exposure integrated device used in the industry is as follows: each of the pre-alignment optical machine and the edge exposure lens is fixed on the base; the horizontal movement module drives the rotary lifting module to move horizontally; and the rotary lifting module sucks the silicon wafer. In the foregoing devices, due to the horizontal movement of the silicon wafer, the apparatus needs to avoid horizontal movement paths of the silicon wafer, which results in a large space of the apparatus. In the industry, there are independent pre-alignment devices and edge exposure devices in which the silicon wafer is fixed, and the pre-alignment optical machine and the edge exposure lens move alternatively. Relatively, the space of the device substantially equals to the size of a piece of silicon wafer, which takes up less space. However, the space of the device is not minimized due to the two independent devices, and, the cost of the apparatus is high due to the large number of motion assembly.

SUMMARY

It is an object of the present application to provide a silicon wafer processing device and method, and particularly to provide a silicon wafer pre-alignment and edge exposure device and method for improving the shortcomings of large space occupation and high cost of the pre-alignment and edge exposure integrated devices used in the prior art, so as to save space and time and improve work efficiency.

In order to achieve the foregoing object, one aspect of the present application provides a silicon wafer processing device for performing a pre-alignment and an edge exposure on a silicon wafer, comprising: a baseplate, a control assembly, a pre-alignment optical assembly, an edge exposure assembly, a wafer supporting unit, and a synchronous bi-directional motion assembly, wherein the synchronous bi-directional motion assembly is fixed on the baseplate; each of the pre-alignment optical assembly and the edge exposure assembly is fixed on the synchronous bi-directional motion assembly; and the pre-alignment optical assembly and the edge exposure assembly are symmetrically distributed relative to a center of the wafer supporting unit; wherein the control assembly is electrically connected to each of the pre-alignment optical assembly, the edge exposure assembly, and the synchronous bi-directional motion assembly; the control assembly controls, according to a size of the silicon wafer and a requirement of a silicon wafer edge exposure position, the synchronous bi-directional motion assembly to drive the pre-alignment optical assembly and the edge exposure assembly to synchronously move towards or opposite to each other relative to the silicon wafer, and further controls the wafer supporting unit to move the silicon wafer.

Preferably, in the foregoing silicon wafer processing device, the wafer supporting unit comprises a rotating stage, a positioning stage, and a motion assembly; and the motion assembly comprises a rotating unit, a lifting unit, and a position compensation unit; wherein the rotating stage is fixed on the rotating unit; and the rotating stage is able to carry the silicon wafer to rotate under a driving of the rotating unit; wherein the rotating unit is fixed on the lifting unit, and the lifting unit is able to drive the rotating unit to move vertically relative to the baseplate; wherein the positioning stage is arranged at a periphery of the rotating stage and is fixed on the position compensation unit, and the positioning stage is able to carry the silicon wafer to move relative to the rotating stage along a horizontal direction under a driving of the position compensation unit.

Preferably, in the foregoing silicon wafer processing device, the synchronous bi-directional motion assembly comprises a linear guide assembly, a driver, a left-right-handed lead screw, a left sliding block, and a right sliding block; wherein the left-right-handed lead screw passes through the left sliding block and the right sliding block and is connected to the driver, the left sliding block and the right sliding block being slidably disposed on the linear guide assembly, the pre-alignment optical assembly being fixed on the left sliding block, the edge exposure assembly being fixed on the right sliding block; wherein the left-right-handed lead screw has a left-handed external thread and a right-handed external thread symmetrically disposed thereon, the left sliding block having a left-handed internal thread matching the left-handed external thread disposed therein, the right sliding block having a right-handed internal thread matching the right-handed external thread disposed therein; and wherein the driver drives the left-right-handed lead screw to rotate, so as to drive the left sliding block and the right sliding block to synchronously move towards or opposite to each other along the linear guide assembly.

Preferably, in the foregoing silicon wafer processing device, the linear guide assembly comprises a first track and a second track disposed in parallel; and each of the left sliding block and the right sliding block is bridged across the first track and the second track.

Preferably, in the foregoing silicon wafer processing device, the synchronous bi-directional motion assembly comprises a linear guide assembly, a driver, a rotating gear, a first rack, and a second rack; wherein the first rack and the second rack are distributed in parallel on both sides of the rotating gear and mesh with the rotating gear; and the rotating gear is connected to the driver; wherein a tooth direction of the first rack is opposite to a tooth direction of the second rack; the pre-alignment optical assembly being fixed on the first rack, the edge exposure assembly being fixed on the second rack; and wherein the driver drives the rotating gear to rotate, so as to drive the first rack and the second rack to synchronously move towards or opposite to each other along the linear guide assembly.

Preferably, in the foregoing silicon wafer processing device, the linear guide assembly comprises a first guide rail and a second guide rail disposed in parallel, the first rack being slidably disposed on the first guide rail, the second rack being slidably disposed on the second guide rail.

Preferably, in the foregoing silicon wafer processing device, the pre-alignment optical assembly comprises a spot light source, a pre-alignment lens, and an image capturing unit; wherein the spot light source emits irradiation light to irradiate an edge of the silicon wafer; wherein the irradiation light passes through the edge of the silicon wafer and reaches the pre-alignment lens, and the image capturing unit collects information of the silicon wafer.

Preferably, in the foregoing silicon wafer processing device, the edge exposure assembly comprises an exposure lens and a diaphragm switching unit; wherein the exposure lens is configured to perform the edge exposure on the silicon wafer; and the diaphragm switching unit is configured to adjust a size of the exposure spot.

In order to achieve the foregoing object, another aspect of the present application provides a method for performing a pre-alignment and an edge exposure on a silicon wafer using any of the foregoing silicon wafer processing devices, comprising:

step 1: placing a silicon wafer on a wafer supporting unit; and controlling, by a control assembly according to a size of the silicon wafer, a synchronous bi-directional motion assembly to drive a pre-alignment optical assembly and an edge exposure assembly to synchronously move towards or opposite to each other relative to the silicon wafer, so as to move the pre-alignment optical assembly to a silicon wafer pre-alignment position;

step 2: controlling, by the control assembly, the wafer supporting unit and the pre-alignment optical assembly to perform a pre-alignment on the silicon wafer;

step 3: controlling, by the control assembly according to the size of the silicon wafer and a requirement of a silicon wafer edge exposure position of the silicon wafer, the synchronous bi-directional motion assembly to drive the pre-alignment optical assembly and the edge exposure assembly to synchronously move forwards or opposite to each other relative to the silicon wafer, so as to move the edge exposure assembly to the silicon wafer edge exposure position of the silicon wafer; and step 4: controlling, by the control assembly, the wafer supporting unit and the edge exposure assembly to perform an edge exposure processing on the silicon wafer.

Preferably, in the foregoing method for performing a pre-alignment and an edge exposure on a silicon wafer, the wafer supporting unit comprises a rotating stage, a positioning stage and a motion assembly, the motion assembly comprising a rotating unit, a lifting unit, and a position compensation unit, wherein step 2 specifically comprises following steps:

step 21: sucking, by the rotating stage, the silicon wafer; driving, by the rotating unit, the rotating stage and the silicon wafer to rotate; collecting, by the pre-alignment optical assembly, an edge information of the silicon wafer; calculating, by the control assembly, an offset of a center of the silicon wafer relative to a center of the rotating stage according to the edge information of the silicon wafer; and determining whether the offset satisfies a centering accuracy between the silicon wafer and the rotating stage; if yes, executing step 26; if not, executing step 22;

step 22: driving, by the rotating stage, the silicon wafer to rotate until a direction in which a maximum value of the offset is located is aligned with a motion direction of the position compensation unit;

step 23: driving, by the lifting unit, the rotating stage and the silicon wafer to move downwards to reach a transfer position of the positioning stage; releasing, by the rotating stage, the silicon wafer; sucking, by the positioning stage, the silicon wafer; and continuing to lower the lifting unit to drive the rotating stage to move to a lower transfer position;

step 24: controlling, by the control assembly according to the offset of the center of the silicon wafer relative to the center of the rotating stage, the position compensation unit to drive the positioning stage to move in a horizontal direction until the center of the silicon wafer coincides with the center of the rotating stage;

step 25: driving, by the lifting unit, the rotating stage to move up to the transfer position; releasing, by the positioning stage, the silicon wafer; sucking, by the rotating stage, the silicon wafer; and returning to step 21;

step 26: driving, by the rotating unit, the rotating stage and the silicon wafer to rotate; collecting, by the pre-alignment optical assembly, the edge information of the silicon wafer; calculating, by the control assembly, a notch position of the silicon wafer according to the edge information of the silicon wafer, and controlling, by the control assembly, a rotation of the rotating unit according to the notch position of the silicon wafer to realize an orientation of the silicon wafer; and step 27: determining whether an orientation accuracy of the silicon wafer is satisfied; if not executing step 26.

In summary, the silicon wafer processing device and method provided in the present application dispose the pre-alignment optical assembly and the edge exposure assembly on the synchronous bi-directional motion assembly, thereby reducing the occupied space of the device and saving the installation cost. The synchronous bi-directional motion assembly, the rotating unit and the position compensation unit that are disposed on the baseplate are controlled by the control assembly, so as to reduce the operation complexity. The synchronous bi-directional motion assembly is controlled to drive the pre-alignment optical assembly and the edge exposure assembly to simultaneously move, so that operations of the pre-alignment and the edge exposure are able to be performed on silicon wafers of different sizes, thereby saving the switching time and improving the work efficiency.

Figure 1:
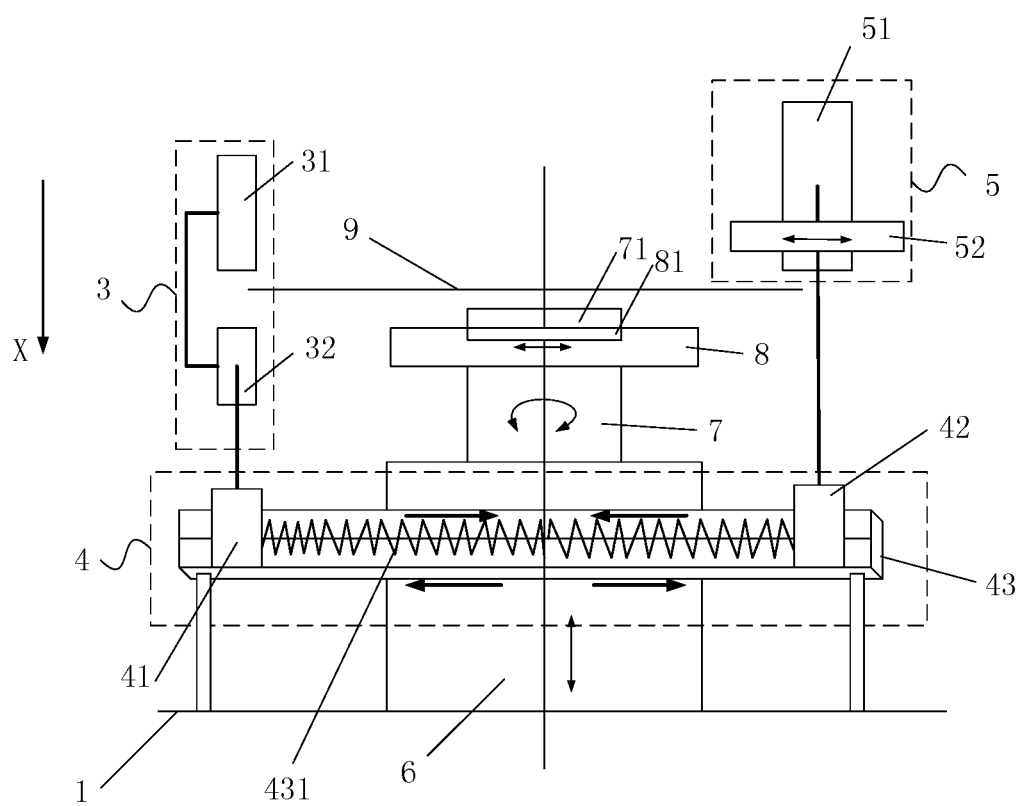
FIG. 1 is a structural front view of a silicon wafer processing device according to an embodiment of the present application.

In the drawings, 1—baseplate; 2—control assembly; 3—pre-alignment optical assembly; 31—pre-alignment lens; 32—spot light source; 4—synchronous bi-directional motion assembly; 41—left sliding block; 42—right sliding block; 43—left-right-handed lead screw; 431—first track; 432—second track; 5—edge exposure assembly; 51—exposure lens; 52—diaphragm switching unit; 6—lifting unit; 7—rotating unit; 71—rotating stage; 8—position compensation unit; 81—positioning stage; 9—silicon wafer.

DETAILED DESCRIPTION

The embodiments of the present application will be described in greater detail below with reference to accompanying figures. Advantages and features of the present application will be more apparent from the description and appended claims. It should be noted that the accompanying drawings are presented in a very simplified form and not necessarily presented to scale, with the only intention to facilitate convenience and clarity in explaining the object of the present invention.

Figure 2:
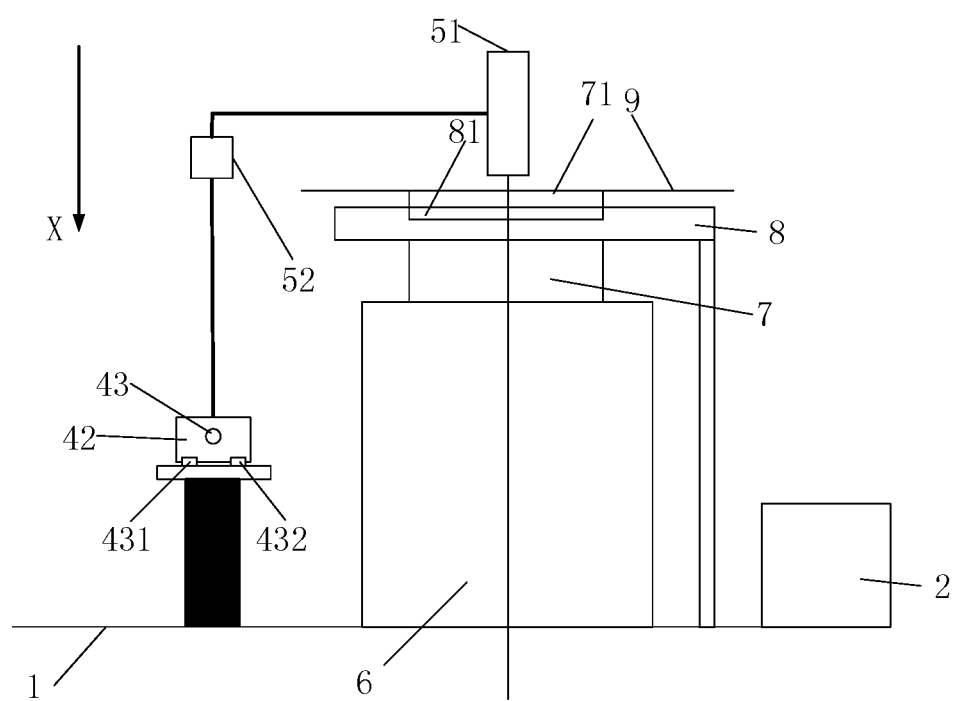
FIG. 2 is a left view of FIG. 1.

Referring to FIG. 1 and FIG. 2, FIG. 1 is a structural front view of a silicon wafer processing device according to an embodiment of the present application, and FIG. 2 is a left view of FIG. 1. The present application provides a silicon wafer processing device for performing the pre-alignment and the edge exposure on a silicon wafer 9, including: a baseplate 1, a control assembly 2, a pre-alignment optical assembly 3, an edge exposure assembly 5, a wafer supporting unit, and a synchronous bi-directional motion assembly 4, wherein the wafer supporting unit includes a rotating stage 71, a positioning stage 81, and a motion assembly; and the motion assembly includes a rotating unit 7, a lifting unit 6, and a position compensation unit 8. The working principle of the pre-alignment optical assembly 3 and the edge exposure assembly 5 has been extensively developed in the prior art. Therefore, details are not described in the embodiments of the present application.

Specifically, the control assembly 2 first controls, according to the size of the silicon wafer 9, the synchronous bi-directional motion assembly 4 to drive the pre-alignment optical assembly 3 and the edge exposure assembly 5 to synchronously move towards or opposite to each other relative to the silicon wafer 9 (here, the control assembly 2 controls the synchronous bi-directional motion assembly 4 to drive the pre-alignment optical assembly 3 and the edge exposure assembly 5 to simultaneously move opposite to each other relative to the silicon wafer 9), so as to move the pre-alignment optical assembly 3 to the pre-alignment position of the silicon wafer 9. Then, the control assembly 2 collects information generated by the pre-alignment optical assembly 3, such as the position information of the silicon wafer edge collected by the pre-alignment optical assembly 3, so as to obtain the relative position of the silicon wafer 9 on the wafer supporting unit, and in turn control the lifting unit 6, the rotating unit 7 and the position compensation unit 8 to perform a pre-alignment on the silicon wafer 9, that is, the relative position of the silicon wafer 9 on the wafer supporting unit is adjusted such that the relative position of the silicon wafer 9 on the wafer supporting unit meets the requirement. Then, the control assembly 2 controls, according to the size of the silicon wafer 9 and the requirement of an edge exposure position of the silicon wafer 9, the synchronous bi-directional motion assembly 4 drive the pre-alignment optical assembly 3 and the edge exposure assembly 5 to synchronously move towards or opposite to each other relative to the silicon wafer 9, so as to move the edge exposure assembly 5 to the edge exposure position of the silicon wafer 9. Finally, the lifting unit 6, the rotating unit 7, the position compensation unit 8, and the edge exposure assembly 5 are controlled to perform an edge exposure processing on the silicon wafer 9, so that the exposure to the predetermined position of the edge of the silicon wafer 9 is able to be achieved.

Referring to FIG. 1 and FIG. 2, the synchronous bi-directional motion assembly 4 is fixed on the baseplate 1, the pre-alignment optical assembly 3 and the edge exposure assembly 5 are fixed on the synchronous bi-directional motion assembly 4, and the axis of pre-alignment optical assembly 3 and the axis of the edge exposure assembly 5 are symmetrically distributed relative to the center of the rotating stage 71. The control assembly 2 is electrically connected to each of the pre-alignment optical assembly 3, the edge exposure assembly 5 and the synchronous bi-directional motion assembly 4. The control assembly 2 controls, according to the size of the silicon wafer 9 and the requirement of the silicon wafer edge exposure position, the synchronous bi-directional motion assembly 4 to drive the pre-alignment optical assembly 3 and the edge exposure assembly 5 to synchronously move towards or opposite to each other relative to the silicon wafer 9. Specifically, the pre-alignment optical assembly 3 includes a spot light source 32, a pre-alignment lens 31, and an image capturing unit, where the spot light source emits irradiation light to irradiate the edge of the silicon wafer. The irradiation light passes through the edge of the silicon wafer and reaches the pre-alignment lens. The image capturing unit collects information of the silicon wafer. The edge exposure assembly 5 includes an exposure lens 51 and a diaphragm switching unit 52, where the exposure lens is configured to perform an edge exposure on the silicon wafer, and the diaphragm switching unit is configured to adjust the size of the exposure spot.

Specifically, in a preferred embodiment of the present application, the synchronous bi-directional motion assembly 4 includes a linear guide assembly, a driver, a left-right-handed lead screw 43, a left sliding block 41, and a right sliding block 42. The left-right-handed lead screw 43 passes through the left sliding block 41 and the right sliding block 42, and is connected to the driver. The linear guide assembly includes a first track 431 and a second track 432 disposed in parallel. Each of the left sliding block 41 and the right sliding block 42 is bridged across the first track 431 and the second track 432. The pre-alignment optical assembly 3 is fixed on the left sliding block 41. The edge exposure assembly 5 is fixed on the right sliding block 42.

Specifically, a left-handed external thread and a right-handed external thread are symmetrically disposed on the left-right-handed lead screw 43. A left-handed internal thread matching the left-handed external thread is disposed inside the left sliding block 41. A right-handed internal thread matching the right-handed external thread is disposed inside the right sliding block 42. When the driver drives the left-right-handed lead screw 43 to rotate, the left sliding block 41 and the right sliding block 42 synchronously move towards or opposite to each other along the first track 431 and the second track 432, so as to drive the pre-alignment optical assembly 3 and the edge exposure assembly 5 to simultaneously move towards or opposite to each other relative to the silicon wafer 9 for the adjustment of the pre-alignment position of the pre-alignment optical assembly 3 and the exposure position of the edge exposure assembly 5.

In the present application, the synchronous bi-directional motion assembly 4 drives the pre-alignment optical assembly 3 and the edge exposure assembly 5 to move simultaneously, simplifying the operation, saving the switching time, simplifying the structure, and reducing the occupied space and cost of the entire device.

The wafer supporting unit includes a rotating stage 71, a positioning stage 81, and a motion assembly. The motion assembly includes a rotating unit 7, a lifting unit 6, and a position compensation unit 8. The lifting unit 6 and the position compensation unit 8 are connected to the baseplate 1, where the position compensation unit 8 can be directly connected to the baseplate 1, or indirectly connected to the baseplate 1 through other components. The rotating unit 7 is disposed on the lifting unit 6. The rotating stage 71 is fixed on the rotating unit 7 for supporting the silicon wafer 9. The lifting unit 6 drives the rotating unit 7 to move along a direction vertically relative to the baseplate 1. The positioning stage 81 is disposed at the periphery of the rotating stage 71 and fixed on the position compensation unit 8 for supporting the silicon wafer 9 to move along the horizontal direction under the driving of the position compensation unit 8, so as to adjust the horizontal position of the silicon wafer 9 relative to the rotating stage 71 to complete pre-alignment.

Specifically, the image capturing unit in the pre-alignment optical assembly 3 collects information of the silicon wafer 9. According to the collected information of the silicon wafer 9, the control assembly 2 controls the lifting unit 6, the rotating unit 7, and the position compensation unit 8 to adjust the offset of the silicon wafer 9 relative to the rotating stage 71, to complete the pre-alignment operation of the silicon wafer 9.

More specifically, the rotating stage 71 sucks the silicon wafer 9. The rotating unit 7 drives the rotating stage 71 and the silicon wafer 9 to rotate. The pre-alignment optical assembly 3 collects the edge information of the silicon wafer. The control assembly 2 calculates the offset of the center of the silicon wafer 9 relative to the center of the rotating stage 71 according to the edge information of the silicon wafer 9, and determines whether the offset satisfies the centering accuracy between the silicon wafer 9 and the rotating stage 71.

If the offset does not satisfy the centering accuracy of the silicon wafer 9 and the rotating stage 71, the rotating stage 71 drives the silicon wafer 9 to rotate until a direction in which a maximum value of the offset is located is aligned with the motion direction of the position compensation unit 8, i.e. a certain horizontal direction. The lifting unit 6 drives the rotating stage 71 and the silicon wafer 9 to move in a direction perpendicular to the baseplate 1 to reach a transfer position of the positioning stage 81. The rotating stage 71 releases the silicon wafer 9, the positioning stage 81 sucks the silicon wafer 9, and the lifting unit 6 continues to descend to drive the rotating stage 71 to move to a lower transfer position (i.e., a position lower than the transfer position). The control assembly 2 controls, according to the offset of the center of the silicon wafer 9 relative to the center of the rotating stage 71, the position compensation unit 8 to drive the positioning stage 82 to move in the horizontal direction until the center of the silicon wafer 9 coincides with the center of the rotating stage 71. The lifting unit 6 drives the rotating stage 71 to move up to the transfer position, the positioning stage 81 releases the silicon wafer 9, and the rotating stage 71 sucks the silicon wafer 9 to complete the pre-alignment operation.

Upon completion of the pre-alignment operation, the rotating unit 7 drives the rotating stage 71 and the silicon wafer 9 to rotate; the pre-alignment optical assembly 3 collects the edge information of the silicon wafer 9; and the control assembly 2 calculates the notch position thereof according to the edge information of the silicon wafer 9, and controls rotation of the rotating unit 7 according to the notch position to achieve the orientation of the silicon wafer 9.

The control assembly 2 controls, according to the size of the silicon wafer 9 and the requirement of the edge exposure position of the silicon wafer 9, the synchronous bi-directional motion assembly 4 to drive the pre-alignment optical assembly 3 and the edge exposure assembly 5 to synchronously move towards or opposite to each other relative to the silicon wafer 9 along the first track 431 and the second track 432, so that the edge exposure assembly 5 is aligned with the edge exposure position of the silicon wafer 9. The control assembly 2 controls the edge exposure assembly 5 on the synchronous bi-directional motion assembly 4 to perform edge exposure processing according to the requirement of the edge exposure.

In a preferred embodiment of the present application, edge exposure, ring exposure, and segmented exposure of the silicon wafer 9 are able to be realized, and the size of the exposure spot is able to be adjusted. Specifically, edge exposure, ring exposure, and segmented exposure of the silicon wafer 9 are able to be realized by the exposure lens 51. The size of the exposure spot is automatically switched by the diaphragm switching assembly 52.

Figure 3:
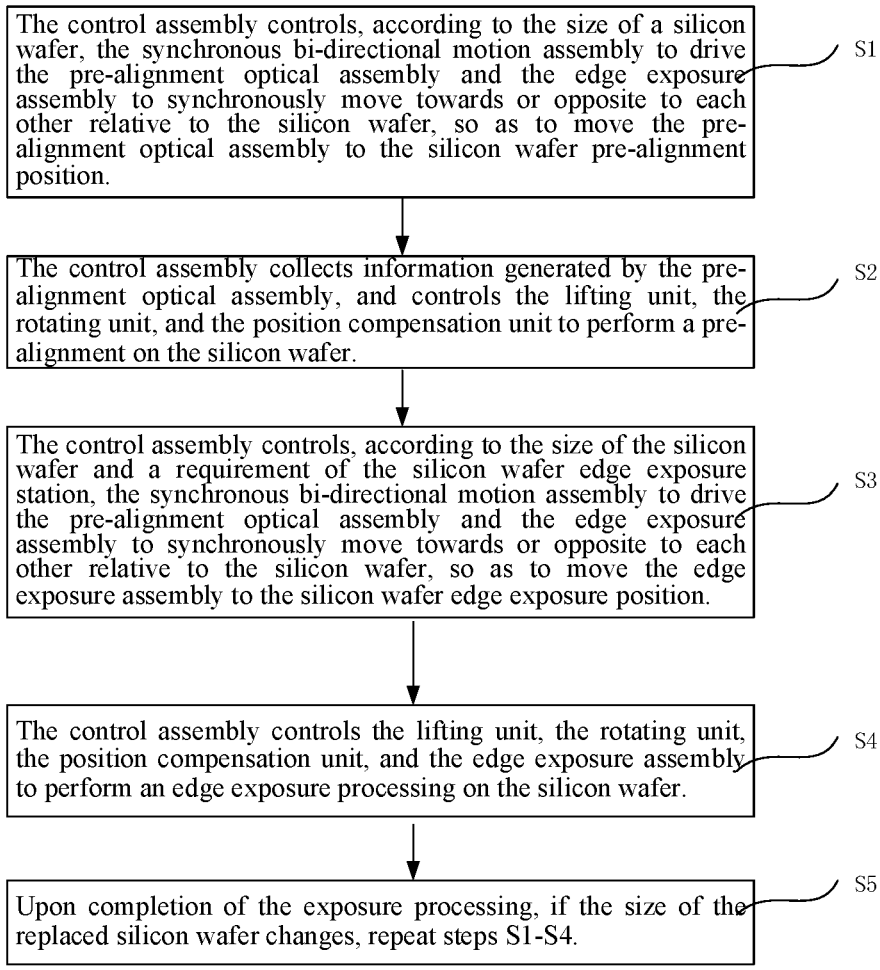
FIG. 3 is a workflow of the pre-alignment and edge exposure on a silicon wafer using a silicon wafer processing device according to an embodiment of the present application.

Further, the foregoing silicon wafer processing device is able to perform a pre-alignment and an edge exposure processing on the silicon wafers 9 of different sizes. The sizes of the silicon wafer 9 include, but are not limited to, 6 inches, 8 inches, and 12 inches. Specifically, as shown in FIG. 3, a workflow of the pre-alignment and edge exposure on a silicon wafer using the silicon wafer processing device according to an embodiment of the present application. Specifically, the steps of performing a pre-alignment and an edge exposure processing on the silicon wafers 9 of different sizes using the foregoing silicon wafer processing device are as follows.

Step S1: controlling, by a control assembly 2 according to the size of a silicon wafer 9, a synchronous bi-directional motion assembly 4 to drive a pre-alignment optical assembly 3 and an edge exposure assembly 5 to synchronously move towards or opposite to each other relative to the silicon wafer 9, so as to move the pre-alignment optical assembly 3 to a silicon wafer pre-alignment position.

Step S2: collecting, by the control assembly 2, the information generated by the pre-alignment optical assembly 3, and controlling a lifting unit 6, a rotating unit 7, and a position compensation unit 8 to perform a pre-alignment on the silicon wafer 9.

Step S3: controlling, by the control assembly 2 according to the size of the silicon wafer 9 and the requirement of an edge exposure position of the silicon wafer 9, the synchronous bi-directional motion assembly 4 to drive the pre-alignment optical assembly 3 and the edge exposure assembly 5 to synchronously move towards or opposite to each other relative to the silicon wafer 9, so as to move the edge exposure assembly 5 to the edge exposure position of the silicon wafer.

Step S4: controlling, by the control assembly 2, the lifting unit 6, the rotating unit 7, the position compensation unit 8, and the edge exposure assembly 5 to perform an edge exposure processing on the silicon wafer 9.

Preferably, in the above steps, if the size of the silicon wafer 9 is 6 inches, the pre-alignment optical assembly 3 is substantially 6 inches apart from the edge exposure assembly 5 when the edge exposure processing is performed. If the size of the silicon wafer 9 is 8 inches, the pre-alignment optical assembly 3 is substantially 8 inches apart from the edge exposure assembly 5 when the edge exposure processing is performed.

Step S5: upon completion of the exposure processing, if the size of the replaced silicon wafer 9 changes, steps S1-S4 are repeated. Specifically, for example, when the size of the silicon wafer 9 changes from 6 inches to 8 inches, the left sliding block 41 and the right sliding block 42 synchronously move opposite to each other along the first track 431 and the second track 432 by at least 25 mm each, respectively, so that the pre-alignment optical assembly 3 is 8 inches or more apart from the edge exposure assembly 5. Then, the pre-alignment and the exposure are able to be obtained by moving the left sliding block 41 and the right sliding blocks 42 to drive the pre-alignment optical assembly 3 and the edge exposure assembly 5 to synchronously move towards or opposite to each other relative to the silicon wafer 9, and controlling the movement of the wafer supporting unit.

Specifically, as described above, the step S2 includes:

The rotating stage 71 sucks the silicon wafer 9. The rotating unit 7 drives the rotating stage 71 and the silicon wafer 9 to rotate. The pre-alignment optical assembly 3 collects the edge information of the silicon wafer. The control assembly 2 calculates the offset of the center of the silicon wafer 9 relative to the center of the rotating stage 71 according to the edge information of the silicon wafer 9, and determines whether the offset satisfies the centering accuracy between the silicon wafer 9 and the rotating stage 71.

If the offset does not satisfy the centering accuracy between the silicon wafer 9 and the rotating stage 71, the rotating stage 71 drives the silicon wafer 9 to rotate until a direction in which a maximum value of the offset is located is aligned with the motion direction of the position compensation unit 8, i.e. a certain horizontal direction. The lifting unit 6 drives the rotating stage 71 and the silicon wafer 9 to move along the vertical direction to reach a transfer position of the positioning stage 81. The rotating stage 71 releases the silicon wafer 9, the positioning stage 81 sucks the silicon wafer 9, and the lifting unit 6 continues to descend to drive the rotating stage 71 to move to a lower transfer position. The control assembly 2 controls, according to the offset of the center of the silicon wafer 9 relative to the center of the rotating stage 71, the position compensation unit 8 to drive the positioning stage 82 to move in the horizontal direction until the center of the silicon wafer 9 coincides with the center of the rotating stage 71. The lifting unit 6 drives the rotating stage 72 to move up to the transfer location, the positioning stage 82 releases the silicon wafer 9, and the rotating stage 72 sucks the silicon wafer 9 to complete the pre-alignment operation.

Figure 4:
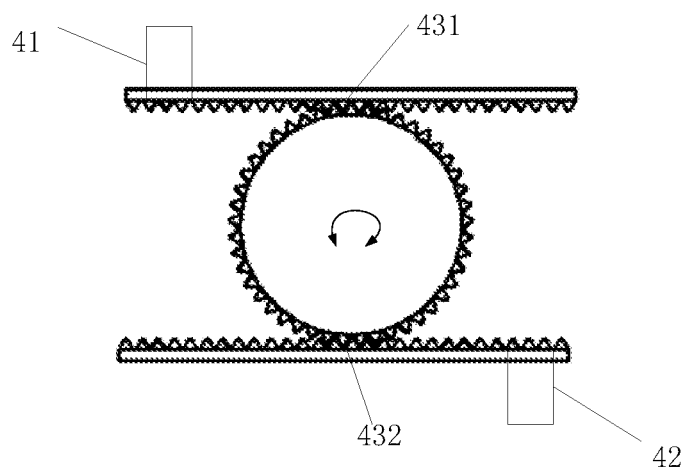
FIG. 4 is a schematic structural diagram of a synchronous bi-directional motion assembly according to another embodiment of the present application.

In another embodiment of the present application, as shown in FIG. 4, a schematic structural diagram of a synchronous bi-directional motion assembly according to another embodiment of the present application. In this embodiment, the synchronous bi-directional motion assembly 4 includes a linear guide assembly, a driver, a rotating gear, a first rack, and a second rack. The first rack and the second rack are distributed in parallel on both sides of the rotating gear and mesh with the rotating gear. The rotating gear is connected to the driver. The tooth direction of the first rack is opposite to that of the second rack. The pre-alignment optical assembly 3 is fixed on the first rack. The edge exposure assembly 5 is fixed on the second rack. The driver drives the rotating gear to rotate, so as to drive the first and second racks to synchronously move towards or opposite to each other along the first track 431 and the second track 432, respectively, thereby adjusting the pre-alignment position of the pre-alignment optical assembly 3 and the exposure position of the edge exposure assembly 4.

Upon completion of the exposure of the silicon wafer 9, if the size of the replaced silicon wafer 9 is different from that of the previous one, it is necessary to readjust the position of the pre-alignment optical assembly 3 and the position of the edge exposure assembly 5. Specifically, when the size of the silicon wafer 9 changes from 6 inches to 8 inches, the rotating gear rotates anticlockwise, and the rotation circumference is at least 25 mm. Thus, the first rack and the second rack move in opposite directions by at least 25 mm each, so that the pre-alignment optical assembly 3 is 8 inches or more apart from the edge exposure assembly 5, and the position adjustment is subsequently completed. When the size of the silicon wafer 9 needs to be changed from 8 inches to 6 inches, the rotating gear rotates clockwise, and the rotation circumference may be 25 mm. Thus, the first rack and the second rack move towards each other by 25 mm each, so that the pre-alignment optical assembly 3 is 6 inches apart from the edge exposure assembly 5.

The present application does not impose any limitation on the materials and sizes of the gears and racks in this embodiment.

In summary, the silicon wafer processing device and method provided in the present application arrange the pre-alignment optical assembly and the edge exposure assembly on the synchronous bi-directional motion assembly, thereby reducing the occupied space of the device and saving the installation cost. The synchronous bi-directional motion assembly, the rotating unit and the position compensation unit that are arranged on the baseplate are controlled by the control assembly, so as to reduce the operation complexity. The synchronous bi-directional motion assembly is controlled to drive the pre-alignment optical assembly and the edge exposure assembly to simultaneously move, so that operations of the pre-alignment and the edge exposure are able to be performed on silicon wafers of different sizes, thereby saving the switching time and improving the work efficiency.

The above are only preferred embodiments of the present application and do not intended to limit the present application. Any form of equivalent substitution or modification to the technical solutions and technical contents disclosed in the present application made by persons skilled in the art without departing from the scope of the technical solutions of the present application are contents within the technical solutions of the invention, and fall within the protection scope of the present application.

What is claimed is:

1. A silicon wafer processing device for performing a pre-alignment and an edge exposure on a silicon wafer, comprising: a baseplate, a control assembly, a pre-alignment optical assembly, an edge exposure assembly, a wafer supporting unit, and a synchronous bi-directional motion assembly, wherein the synchronous bi-directional motion assembly is fixed on the baseplate; each of the pre-alignment optical assembly and the edge exposure assembly is fixed on the synchronous bi-directional motion assembly; and the pre-alignment optical assembly and the edge exposure assembly are symmetrically distributed relative to a center of the wafer supporting unit; wherein the control assembly is electrically connected to each of the pre-alignment optical assembly, the edge exposure assembly, and the synchronous bi-directional motion assembly; and the control assembly controls, according to a size of the silicon wafer and requirement of a silicon wafer edge exposure position, the synchronous bi-directional motion assembly to drive the pre-alignment optical assembly and the edge exposure assembly to synchronously move towards or opposite to each other relative to the silicon wafer, and further controls the wafer supporting unit to move the silicon wafer.

2. The silicon wafer processing device according to claim 1, wherein the wafer supporting unit comprises a rotating stage, a positioning stage, and a motion assembly; and the motion assembly comprises a rotating unit, a lifting unit, and a position compensation unit; wherein the rotating stage is fixed on the rotating unit, and the rotating stage is able to carry the silicon wafer to rotate under a driving of the rotating unit; wherein the rotating unit is fixed on the lifting unit, and the lifting unit is able to drive the rotating unit to move vertically relative to the baseplate; wherein the positioning stage is arranged at a periphery of the rotating stage and is fixed on the position compensation unit, and the positioning stage is able to carry the silicon wafer to move relative to the rotating stage along a horizontal direction under a driving of the position compensation unit.

3. The silicon wafer processing device according to claim 1, wherein the synchronous bi-directional motion assembly comprises a linear guide assembly, a driver, a left-right-handed lead screw, a left sliding block, and a right sliding block; wherein the left-right-handed lead screw passes through the left sliding block and the right sliding block and is connected to the driver, the left sliding block and the right sliding block being slidably disposed on the linear guide assembly, the pre-alignment optical assembly being fixed on the left sliding block, the edge exposure assembly being fixed on the right sliding block; wherein the left-right-handed lead screw has a left-handed external thread and a right-handed external thread symmetrically disposed thereon, the left sliding block having a left-handed internal thread matching the left-handed external thread disposed therein, the right sliding block having a right-handed internal thread matching the right-handed external thread disposed therein; and wherein the driver drives the left-right-handed lead screw to rotate, so as to drive the left sliding block and the right sliding block to synchronously move towards or opposite to each other along the linear guide assembly.

4. The silicon wafer processing device according to claim 3, wherein the linear guide assembly comprises a first track and a second track disposed in parallel; and each of the left sliding block and the right sliding block is bridged across the first track and the second track.

5. The silicon wafer processing device according to claim 1, wherein the synchronous bi-directional motion assembly comprises a linear guide assembly, a driver, a rotating gear, a first rack, and a second rack; wherein the first rack and the second rack are distributed in parallel on both sides of the rotating gear and mesh with the rotating gear, and the rotating gear is connected to the driver; wherein a tooth direction of the first rack is opposite to a tooth direction of the second rack, the pre-alignment optical assembly being fixed on the first rack, the edge exposure assembly being fixed on the second rack; and wherein the driver drives the rotating gear to rotate, so as to drive the first rack and the second rack to synchronously move towards or opposite to each other along the linear guide assembly.

6. The silicon wafer processing device according to claim 5, wherein the linear guide assembly comprises a first guide rail and a second guide rail disposed in parallel, the first rack being slidably disposed on the first guide rail, the second rack being slidably disposed on the second guide rail.

7. The silicon wafer processing device according to claim 1, wherein the pre-alignment optical assembly comprises a spot light source, a pre-alignment lens, and an image capturing unit; wherein the spot light source emits irradiation light to irradiate an edge of the silicon wafer; wherein the irradiation light passes through the edge of the silicon wafer and reaches the pre-alignment lens, and the image capturing unit collects information of the silicon wafer.

8. The silicon wafer processing device according to claim 1, wherein the edge exposure assembly comprises an exposure lens and a diaphragm switching unit; wherein the exposure lens is configured to perform the edge exposure on the silicon wafer; and the diaphragm switching unit is configured to adjust a size of an exposure light spot.

9. A method for silicon wafer processing using the silicon wafer processing device according to claim 1, comprising:
   step 1: placing a silicon wafer on a wafer supporting unit; and controlling, by a control assembly according to a size of the silicon wafer, a synchronous bi-directional motion assembly to drive a pre-alignment optical assembly and an edge exposure assembly to synchronously move towards or opposite to each other relative to the silicon wafer, so as to move the pre-alignment optical assembly to a silicon wafer pre-alignment position;
   step 2: controlling, by the control assembly, the wafer supporting unit and the pre-alignment optical assembly to perform a pre-alignment on the silicon wafer;
   step 3: controlling, by the control assembly according to the size of the silicon wafer and a requirement of a silicon wafer edge exposure position, the synchronous bi-directional motion assembly to drive the pre-alignment optical assembly and the edge exposure assembly to synchronously move towards or opposite to each other relative to the silicon wafer, so as to move the edge exposure assembly to the silicon wafer edge exposure position; and
   step 4: controlling, by the control assembly, the wafer supporting unit and the edge exposure assembly to perform an edge exposure processing on the silicon wafer.

10. The method for silicon wafer processing according to claim 9, wherein the wafer supporting unit comprises a rotating stage, a positioning stage and a motion assembly; the motion assembly comprising a rotating unit, a lifting unit, and a position compensation unit, wherein step 2 specifically comprises the following steps:
   step 21: sucking, by the rotating stage, the silicon wafer; driving, by the rotating unit, the rotating stage and the silicon wafer to rotate; collecting, by the pre-alignment optical assembly, an edge information of the silicon wafer; calculating, by the control assembly, an offset of a center of the silicon wafer relative to a center of the rotating stage according to the edge information of the silicon wafer; and determining, by the control assembly, whether the offset satisfies a centering accuracy between the silicon wafer and the rotating stage; if yes, executing step 26; if not, executing step 22;
   step 22: driving, by the rotating stage, the silicon wafer to rotate until a direction in which a maximum value of the offset is located is aligned with a motion direction of the position compensation unit;
   step 23: driving, by the lifting unit, the rotating stage and the silicon wafer to move downwards to reach a transfer position of the positioning stage; releasing, by the rotating stage, the silicon wafer; sucking, by the positioning stage, the silicon wafer; and continuing to lower the lifting unit to drive the rotating stage to move to a lower transfer position;
   step 24: controlling, by the control assembly according to the offset of the center of the silicon wafer relative to the center of the rotating stage, the position compensation unit to drive the positioning stage to move in a horizontal direction until the center of the silicon wafer coincides with the center of the rotating stage;

step 25: driving, by the lifting unit, the rotating stage to move up to the transfer position; releasing, by the positioning stage, the silicon wafer; sucking, by the rotating stage, the silicon wafer; and returning to step 21;

step 26: driving, by the rotating unit, the rotating stage and the silicon wafer to rotate; collecting, by the pre-alignment optical assembly, the edge information of the silicon wafer; calculating, by the control assembly, a notch position of the silicon wafer according to the edge information of the silicon wafer, and controlling, by the control assembly, a rotation of the rotating unit according to the notch position of the silicon wafer to realize an orientation of the silicon wafer; and step 27: determining whether an orientation accuracy of the silicon wafer is satisfied; if not, executing step 26.

* * * * *